United States Patent [19]

Imai

[11] Patent Number: 5,317,008
[45] Date of Patent: May 31, 1994

[54] METHOD OF MANUFACTURING BISMUTH TYPE OXIDE SUPERCONDUCTOR

[75] Inventor: Kumiko Imai, Yokohama, Japan

[73] Assignee: The Furukawa Electric Co., Ltd., Tokyo, Japan

[21] Appl. No.: 8,081

[22] Filed: Jan. 22, 1993

Related U.S. Application Data

[63] Continuation of Ser. No. 381,134, Jul. 14, 1989, abandoned.

[30] Foreign Application Priority Data

Jul. 20, 1988 [JP] Japan ............................. 63-180781
Oct. 14, 1988 [JP] Japan ............................. 63-259108

[51] Int. Cl.$^5$ ............................................. H01L 39/24
[52] U.S. Cl. ............................. 505/100; 29/599; 252/518; 252/521; 505/739; 505/742; 505/782
[58] Field of Search ................... 29/599; 505/1, 734, 505/725, 739, 742, 782; 252/518, 521

[56] References Cited

U.S. PATENT DOCUMENTS

4,880,771 11/1989 Cava et al. ......................... 505/1
4,950,643 8/1990 Agostinelli et al. ................ 505/1
4,959,347 9/1990 Kobayashi et al. ................. 505/1
4,990,488 2/1991 von Schnering et al. ............ 505/1

OTHER PUBLICATIONS

Ishida et al, "Superconducting Transitions of BiSr-CaCu$_2$O$_x$ Quenched from High Temperatures", Jul. 1988, pp. 1237–1240; Japanese Journal of Applied Physics, vol. 27, No. 7.

T. Minami et al, "Glass Formation of High-Tc Compound BiCaSrC$_2$O$_x$ by Rapid Quenching", May 1988, pp. L777–L778; Japanese Journal of Applied Physics, vol. 27, No. 5.

H. Medelius et al, "Physical Properties of Bi$_1$Ca$_1$Sr$_1$Cu$_2$O$_x$ Superconductor Obtained by Rapid Quenching from the Melt", Apr. 1988, pp. 261–263; C. Physica, vol. 152, No. 4.

C. Politis, "High-T Superconductivity in the Multi Phases Sr-Bi-Ca-Cu-O", Mar. 1988, pp. 261–263; Applied Physics A. Solids and Surfaces, vol. 45.

H. Maeda, et al, A New High-Tc Oxide Superconductor Without a Rare Earth Element; Jpn. J. Appl. Phys. 27 (1988) L209–L210.

J. M. Tarascon, et al, Crystal Substructure and Physical Properties of the Superconducting Phase . . . Phys. Rev. B37 (1988) 9382–9389.

T. Ishida, et al, Bulk Nature of Quenched-Enhanced Superconductivity . . . Jpn. J. Appl. Phys. 27 (1988) L1626–L1628.

H. Niu, et al, Effect of Oxygen Content and Sr/Ca Ratio on Superconducting Properties . . . Jpn. J. Appl. Phys. 27 (1988) L1442–L1444.

*Primary Examiner*—Joseph M. Gorski
*Attorney, Agent, or Firm*—Frishauf, Holtz, Goodman & Woodward

[57] ABSTRACT

A method of manufacturing a bismuth oxide superconductor, wherein a molded body of a bismuth oxide superconducting substance comprising bismuth, an alkaline earth metal, copper, and oxygen or a precursor thereof is subjected to a heat treatment for producing a superconducting phase and then subjected to one step selected from (1) a step of cooling the heated body from 700° C. to 200° C. in an atmosphere having an oxygen partial pressure of not less than 0.1 atm at a cooling rate of not less than 10° C./min, (2) a step of cooling the heated body from 700° C. in an atmosphere having an oxygen partial pressure of less than 0.1 atm at a cooling rate of less than 10° C./min, and (3) a step of cooling the heated body, and then performing a heat treatment for the cooled heated body in an atmosphere having an oxygen partial pressure of not more than 0.1 atm at a temperature from 700° C. to 200° C.

18 Claims, No Drawings

METHOD OF MANUFACTURING BISMUTH TYPE OXIDE SUPERCONDUCTOR

This application is a continuation of application Ser. No. 07/381,134, filed Jul. 14, 1989, and now abandoned.

BACKGROUND OF THE INVENTION

1. Field of the Invention

The present invention relates to a method of manufacturing a bismuth type oxide superconductor.

2. Description of the Related Art

In recent years, an oxide superconductor (to be abbreviated as a Y type oxide superconductor hereinafter) comprising a rare earth element, an alkaline earth metal, copper, and oxygen, for example, Y-Ba-Cu-O type oxide superconductor has been developed. However, since the yttrium (Y) type oxide superconductor absorbs moisture and is degraded within a short time period, it is very difficult to put the superconductor of this type into practical use. Recently, an oxide superconductor (to be abbreviated as a Bi type oxide superconductor hereinafter) comprising bismuth, an alkaline earth metal, copper, and oxygen has been found. This Bi type oxide superconductor does not absorb moisture nor is degraded unlike the Y type oxide superconductor. Therefore, extensive studies have been made in various fields in order to put the superconductor of this type into practical use.

The oxide superconductor of a Bi-Sr-Ca-Cu-O type or the like comprising Bi, an alkaline earth metal, copper, and oxygen has a high critical temperature ($T_C$) and therefore is expected to be used in a wide range of applications. An oxide type superconductor molded body consisting of the above oxide superconductor has conventionally been manufactured as follows. That is, an oxide, a carbonate, and the like (e.g., a combination of $Bi_2O_3$, $SrCO_3$, $CaCO_3$, $CuO$ and the like) are used as materials, and these primary materials are mixed to obtain a desired composition. The resultant mixture is preburned to prepare a composite oxide. The prepared composite oxide is milled to obtain a secondary material powder. The secondary material powder is molded into a desired shape, sintered normally at a temperature of 800° to 900° C., and slowly cooled in the same atmosphere at a rate of 1° to 2°C./min, thereby manufacturing the molded body.

Although the oxide superconductor molded body manufactured by the above conventional method slightly contains a high-temperature phase having a critical temperature ($T_C$) close to 110 to 120K, it also contains a low-temperature phase (85-K phase) having $T_C$ close to 85K, a phase having lower $T_C$ (50 to 60K), and non-superconducting phases of a Ca-Cu-O type, a Bi-Sr-O type, and the like.

The most widely studied method is a method of obtaining a so-called high-temperature phase having $T_C$ of 110 to 120K. In order to produce the high-temperature phase, however, a heating/sintering treatment must be performed for a very long time period. In addition, critical current density (to be abbreviated as $J_C$ hereinafter) of the high-temperature phase is low.

A so-called low-temperature phase having $T_C$ of 80 to 90K and high $J_C$ can be produced by performing a heating/sintering treatment for a comparatively short time period. However, variations in units of lots are very large, and it is difficult to stably obtain a high-performance phase.

SUMMARY OF THE INVENTION

In consideration of the above situation, the present inventors have made extensive studies and found that a low-temperature phase having high performance cannot be stably obtained because oxygen is excessively absorbed in the phase and have made further extensive studies to reach the present invention, i.e., a method of manufacturing a Bi type oxide superconductor superior in superconducting properties such as $T_C$ and $J_C$.

The present invention is a method of manufacturing a bismuth type oxide superconductor, wherein a molded body of a bismuth type oxide superconducting substance comprising bismuth, an alkaline earth metal, copper, and oxygen or a precursor thereof is subjected to a heat treatment for producing a superconducting phase and then subjected to one step selected from the group consisting of (1) a step of cooling the heated body from 700° C. to 200° C. in an atmosphere having an oxygen partial pressure of not less than 0.1 atm at a cooling rate of not less than 10° C./min (to be abbreviated as step A hereinafter), (2) a step of cooling the heated body from 700° C. in an atmosphere having an oxygen partial pressure of less than 0.1 atm at a cooling rate of less than 10° C./min (to be abbreviated as step B hereinafter), and (3) a step of cooling the heated body, and then performing a heat treatment for the cooled heated body in an atmosphere having an oxygen partial pressure of not more than 0.1 atm at a temperature from 700° C. to 200° C. (to be abbreviated as step C hereinafter).

DETAILED DESCRIPTION OF THE PREFERRED EMBODIMENTS

The precursor of the bismuth type oxide superconductor comprising bismuth, an alkaline earth metal, copper, and oxygen is a mixture of bismuth or a compound containing bismuth, an alkaline earth metal or a compound containing an alkaline earth metal, and copper or a compound containing copper, or a composite oxide containing elements such as bismuth, an alkaline earth metal, and copper. These substances will be called a "precursor" hereinafter.

In the method of the present invention, a molded body of a bismuth type oxide superconducting substance or its precursor can be subjected to a heat treatment for producing a superconducting phase, and then subjected to the step A. In this case, a cooling rate is increased in an atmosphere of an oxygen partial pressure of 0.1 atm or more in order to prevent the heated body from excessively absorbing oxygen. If the cooling rate is less than 10° C./min, a large amount of oxygen is absorbed because the cooling time is prolonged, and therefore desired superconducting properties cannot be obtained. If cooling is performed from a temperature exceeding 700° C., a thermal strain occurs since cooling is fast, thereby producing cracks in the heated body. When the step B is to be performed, an oxygen partial pressure in the atmosphere is reduced at a low cooling rate of less than 10° C./min from 700° C. in order to prevent the heated body from excessively absorbing oxygen. If the oxygen partial pressure in the atmosphere is 0.1 atm or more, an absorption amount of oxygen is increased, and therefore desired superconducting properties cannot be obtained.

The step C is performed in order to remove oxygen excessively absorbed by the heated body. If the oxygen partial pressure exceeds 0.1 atm and a heat treatment temperature is more than 700° C. or less than 200° C., the above oxygen amount cannot be an adequate amount, and therefore desired superconducting properties cannot be obtained.

In the present invention, when the molded body of the superconductor substance comprising bismuth, an alkaline earth metal, copper, and oxygen or its precursor is sintered within a temperature range from a temperature of $T_M - 20°$ C. (inclusive) where $T_M$ is the melting start temperature of the superconductor substance or its precursor to a temperature of $T_M + 40°$ C. (exclusive), a single phase of an 85-K class superconducting phase ($Bi_2$—$Sr_2$—Ca—$Cu_2$—Ox) can be formed within a comparatively short time period. When the resultant substance is heated in an atmosphere having an oxygen partial pressure of 0.2 atm or more within a temperature range of 700° to 890° C. to absorb oxygen, an optimal composition for realizing superconducting properties can be obtained.

If the sintering temperature is less than a temperature of $T_M - 20°$ C. where $T_M$ is the melting start temperature ($T_M$) of the superconducting substance or its precursor, it is difficult to form the single phase of the 85-K class superconducting phase within a comparatively short time period. If the sintering temperature exceeds a temperature of $T_M + 40°$ C., segregation of the composition occurs upon solidification. As a result, it is difficult to obtain the single phase of the 85-K class superconducting phase and to maintain the shape of the superconducting molded body. Therefore, the sintering treatment must be performed within a temperature range from a temperature of $T_M - 20°$ C. (inclusive) where $T_M$ is the melting start temperature of the superconducting substance or its precursor to a temperature of $T_M + 40°$ C. (exclusive) (e.g., 890° C. to 950° C. in an oxygen flow and 880° C. to 940° C. in the air).

When the sintered molded body is to be heated to absorb oxygen, if an oxygen partial pressure in an atmosphere is less than 0.2 atm or a heating temperature is less than 700° C. or more than 890° C., oxygen absorption becomes insufficient, and an optimal composition for realizing superconducting properties cannot be obtained. Therefore, heating must be performed in an atmosphere having an oxygen partial pressure of 0.2 atm or more within a temperature range from 700° to 890° C., more preferably, 800° to 850° C.

The above heating treatment is preferably performed, from a viewpoint of a heat efficiency, by cooling to a predetermined heating temperature after the sintering treatment is finished and successively performing the heating treatment. Alternatively, the heating treatment may be performed by cooling to a room temperature after the sintering treatment is finished and then heating to a predetermined heating temperature. In the former case, a cooling pattern for cooling to a predetermined heating temperature after the sintering treatment is finished is not limited but may be a cooling pattern in which a desired temperature is held for a desired period of time during cooling.

When the Bi type superconducting molded body which obtains the single phase of the 85-K class superconducting phase by the above sintering and burning treatments is cooled to a room temperature, a reaction for absorbing oxygen and decreasing the critical temperature occurs more easily at a lower temperature. Therefore, in order to prevent this reaction, quenching must be performed at least within a temperature range from 500° C. to 200° C. That is, if a cooling rate in this temperature range is less than 10° C./min, the critical current density ($J_C$) of the superconductor is reduced. Therefore, quenching must be performed at a cooling rate of 10° C./min or more at least within the temperature range of 500° to 200° C.

If a temperature at which quenching is started exceeds 700° C., cracks or the like are produced due to thermal strain to decrease the critical current density ($J_C$). In this case, a large crack may be produced in a large molded body, and therefore a molded body of a desired shape cannot be obtained. For this reason, the molded body must be quenched at a cooling rate of 10° C./min or more, or must be cooled in an atmosphere of low oxygen pressure, from a desired temperature falling within the range from 700° to 500° C. to a temperature of 200° C. or less.

In the method of the present invention, the heated/sintered body of the molded body of the superconducting substance comprising bismuth, an alkaline earth metal, copper, and oxygen or its precursor is heated in an atmosphere having an oxygen partial pressure of 0.2 atm or more within a temperature range from 700° to 890° C. and then cooled under proper cooling conditions. Therefore, oxygen is sufficiently absorbed, and an optimal composition for realizing superconducting properties can be obtained. In addition, upon cooling to the room temperature performed after the heating treatment is finished, when quenching is performed at a cooling rate of 10° C./min or more from 700° C.~500° C. to 200° C. or less, excessive oxygen absorption can be prevented. In this case, cracks or the like are not produced due to thermal strain upon quenching, and therefore a superconducting molded body having high critical current density ($J_C$) can be obtained.

The present invention will be described in more detail below by way of its examples.

EXAMPLE 1

Oxides ($Bi_2O_3$, $CaCO_3$, $SrCO_3$, and CuO) were mixed at an atomic ratio of Bi:Ca:Sr:Cu of 2:2:1:2.05 to form a material powder, and the material powder was preheated in an atmosphere at 800° C. for six hours to form a preheated body. The obtained preheated body was milled and classified to form a preheated powder, and the preheated powder was pressure and molded into 2×3×20-mm rectangular blocks. The pressurized/molded bodies were sintered, at 910° C. for 30 minutes and then heated at 850° C. for six hours in an oxygen atmosphere. Thereafter, the sintered/heated bodies were cooled in the above oxygen atmosphere to 700° C. at a rate of 5° C./min and then cooled from 700° C. to 100° C. at different cooling rates and in different cooling atmospheres and then were allowed to cool to room temperature, thereby manufacturing Bi-Sr-Ca-Cu-O type oxide superconductors.

$T_C$ and $J_C$ of each Bi type superconductor were measured.

The measurement results are listed in Table 1.

TABLE 1

| Example 1 | | Sintering Conditions (°C. × hr) | Heating Conditions (°C. × hr) | Heat Treatment Atmosphere | Cooling Conditions 700~100° C. | | Tc K | Jc* A/cm² |
|---|---|---|---|---|---|---|---|---|
| | | | | | Atmosphere | Rate °C./min | | |
| Present Invention Product | 1* | 910 × 0.5 | 850 × 6 | O₂ Atmosphere | O₂ | 100 | 93 | 1300 |
| | 2* | " | " | " | " | 12 | 90 | 1000 |
| | 3* | " | " | " | Air | 12 | 91 | 1100 |
| | 4** | " | " | " | O₂ Partial Pressure 0.08 atm | 2 | 92 | 1200 |
| | 5** | " | " | " | N₂ | 5 | 94 | 1480 |
| Comparative Example Product | 6 | " | " | " | O₂ | 2 | 81 | 20 |
| | 7 | " | " | " | Air | 2 | 83 | *30 |

*Step A Treatment
**Step B Treatment
*In liquid nitrogen (77K), measured by a four terminals method.

As is apparent from Table 1, both the $T_C$ and $J_C$ values of the present invention products (1 to 5) were higher than those of the comparative example products (6 and 7). That is, although Nos. 1 to 3 of the present invention products were treated in cooling atmospheres having O₂ partial pressures of 0.1 atm or more, cooling rates were high, 10° C./min or more. Nos. 4 and 5 were treated at low cooling rates of less than 10° C./min, but cooling atmospheres had O₂ partial pressures less than 0.1 atm. In either case, therefore, oxygen absorption upon cooling was suppressed to increase the $T_C$ and $J_C$ values. On the contrary, both the cooling atmospheres and rates of the comparative example products fell outside the limited ranges of the present invention. Therefore, oxygen was absorbed in the heated/sintered bodies to decrease both the $T_C$ and $J_C$ values.

EXAMPLE 2

The Bi type oxide superconductors No. 6, i.e., the heated/sintered bodies manufactured in Example 1 were subjected to a heat treatment (step C treatment) under different treatment conditions.

$T_C$ and $J_C$ values of the Bi type oxide superconductors subjected to the above heat treatment were measured.

The measurement results are listed in Table 2 together with the heat treatment conditions.

TABLE 2

| Classification | No | Heat Treatment | | Tc K | Jc* A/cm² |
|---|---|---|---|---|---|
| | | Atmosphere | Temperature · Time | | |
| Present Invention Product | 8 | N₂ | 400° C. · 6H | 93 | 1500 |
| | 9 | *O₂ Partial Pressure 0.08 atm | 400° C. · 6H | 92 | 1100 |
| | 10 | *O₂ Partial Pressure 0.08 atm | 650° C. · 3H | 95 | 1650 |
| | 11 | *O₂ Partial Pressure 0.08 atm | 120° C. · 20H | 91 | 1000 |
| Comparative Example Product | 12 | *O₂ Partial Pressure 0.2 atm | 400° C. · 6H | 84 | 50 |
| | 13 | N₂ | 800° C. · 2H | 82 | 30 |
| | 14 | N₂ | 90° C. · 40H | 83 | 40 |

*Total Pressure: 0.4 atm. The remainder: N₂
*Measured by the same method as in Example 1.

As is apparent from Table 2, both the $T_C$ and $J_C$ values of the present invention products (8 to 11) were higher than the product No. 6 manufactured by a conventional method. This is because excessive oxygen absorbed in the superconductors No. 6 were removed by the heat treatment (step C treatment) defined by the present invention.

On the contrary, the $T_C$ and $J_C$ values of the comparative example products (12 to 14) were at most the same as those of the product No. 6. This is because excessive oxygen was removed insufficiently or too much since the heat treatment conditions fell outside the limited ranges of the present invention.

EXAMPLE 3

Bi₂O₃, SrCO₃, CaCO₃, and CuO powders as materials were mixed at a molar ratio of Bi:Sr:Ca:Cu=2:1:2 and preheated in an oxygen flow under the conditions of 800° C.×6 hr. The preheated body was milled and classified into a powder having an average particle size of 2 μm or less and then molded into a 2-mm thick, 3-mm wide, 20-mm long block.

The molded block was sintered in an oxygen flow under the conditions of 910° C. 0.5 hr, cooled to 850° C., heated in an oxygen flow under the conditions of 850° C.×6 hr, slowly cooled to 700° C. or 500° C. at a cooling rate of 1° C./min, and then quenched to a room temperature (cooling rate: 20° C./min), as listed in Table 3.

EXAMPLE 4

A block prepared following the same procedures as in Example 3 was sintered in an oxygen flow under the conditions of 900° C.×1 hr and 915° C.×0.5 hr, heated under the conditions of 880° C.×6 hr, further heated under the conditions of 850° C.×6 hr, slowly cooled to 700° C. at a cooling rate of 1° C./min, and then quenched to a room temperature (cooling rate: 20° C./min).

EXAMPLE 5

A block prepared following the same procedures as in Example 3 was sintered in an atmosphere under the conditions of 910° C.×0.5 hr, heated under the conditions of 850° C.×6 hr, slowly cooled to 700° C. at a cooling rate of 1° C./min, and then quenched to a room temperature (cooling rate: 20° C./min).

conditions of 850° C.×6 hr or 850° C.×30 hr, slowly cooled to 700° C. at a cooling rate of 1° C./min, and then quenched to a room temperature (cooling rate: 20° C./min).

Microstructures of the superconducting molded bodies prepared by Examples 3 to 5 and Comparative Examples 1 to 4 were observed, and their superconducting properties such as a critical temperature ($T_C$) and a critical current density ($J_C$) were measured. Both the observation and measurement results are listed in Table 3.

TABLE 3

| | No | Sintering Conditions (°C. × hr) | Heating Conditions (°C. × hr) | Heat Treatment Atmosphere | Cooling Conditions After Heating Treatment × 1 | Structure*2 | Jc (A/cm$^2$) | Tc (K) | Remarks |
|---|---|---|---|---|---|---|---|---|---|
| Example-3 Product | 15 | 910 × 0.5 | 850 × 6 | O$_2$ Flow | Quenching From 700° C. | Single Phase | 300 | 88 | — |
| | 16 | 910 × 0.5 | 850 × 6 | " | Quenching From 500° C. | Single Phase | 295 | 87 | — |
| Example-4 Product | 17 | 900 × 1→ 915 × 0.5 | 880 × 6→ 850 × 6 | O$_2$ Flow | Quenching From 700° C. | Single Phase | 350 | 88 | — |
| Example-5 Product | 18 | 915 × 0.5 | 850 × 6 | Air | Quenching From 700° C. | Single Phase | 298 | 88 | — |
| Comparative Example-1 Product | 19 | 910 × 0.5 | 850 × 6 | O$_2$ Flow | Quenching From 850° C. | Single Phase | 240 | 87 | Cracks |
| | 20 | 910 × 0.5 | 850 × 6 | O$_2$ Flow | Slow Cooling From 850° C. | Single Phase | 0.5 | 80 | — |
| Comparative Example-2 Product | 21 | 910 × 0.5 | 880 × 6 | O$_2$ Flow | Quenching From 700° C. | Single Phase | 210 | 83 | — |
| Comparative Example-3 Product | 22 | 880 × 6 | 850 × 6 | O$_2$ Flow | Quenching From 700° C. | Mixed Phase | 0.5 | 79 | — |
| Comparative Example-4 Product | 23 | 850 × 6 | — | O$_2$ Flow | Quenching From 700° C. | Mixed Phase | 0.1 | 78 | — |
| | 24 | 850 × 30 | — | O$_2$ Flow | Quenching From 700° C. | Mixed Phase | 0.5 | 79 | — |

(*1)Quenching: Cooling Rate = 20° C./min
Slow Cooling: Cooling Rate = 1° C./min
(*2)Single Phase: a single phase of an 85-K class superconducting phase.
Mixed Phase: a mixed phase in which an 85-K class phase, a phase having a lower Tc value (50~60K), a non-superconducting phase, and the like are mixed.

COMPARATIVE EXAMPLE 1

A block prepared following the same procedures as in Example 3 was sintered under the same conditions as in Example 1, cooled to 850° C., and heated under the conditions of 850° C.×6 hr. Thereafter, the resultant block was quenched to a room temperature (cooling rate: 20° C./min) or slowly cooled at a cooling rate of 1° C./min, as listed in Table 3, thereby preparing a superconducting molded body.

COMPARATIVE EXAMPLE 2

A block prepared following the same procedures as in Example 3 was sintered under the same conditions as in Example 3, heated under the conditions of 880° C.×6 hr, slowly cooled to 700° C. at a cooling rate of 1° C./min, and then quenched to a room temperature (cooling rate: 20° C./min).

COMPARATIVE EXAMPLE 3

A block prepared following the same procedures as in Example 3 was sintered in an oxygen flow under the conditions of 880° C.×6 hr, burned under the conditions of 850° C.×6 hr, slowly cooled to 700° C. at a cooling rate of 1° C./min, and then quenched to a room temperature (cooling rate: 20° C./min).

COMPARATIVE EXAMPLE 4

A block prepared following the same procedures as in Example 3 was sintered in an oxygen flow under the As is apparent from Table 3, each of the products of Examples 3 to Example 5 had a uniform single phase having $T_C$ of 85K and had a high $J_C$ value. On the contrary, each of the products of Comparative Examples 3 and 4 sintered under the conditions outside the ranges of the present invention had a mixed phase in which the above 85-K phase, a phase having a lower $T_C$ value (50 to 60K), a non-superconducting phase of a Ca-Cu-O type or Bi-Sr-Cu-O type, and the like were mixed and had only a lower $J_C$ value. The product of Comparative Example 2 sintered under the conditions falling within the range of the present invention but heated under the conditions outside the ranges of the present invention had a single phase. However, since absorption of oxygen was insufficient upon heating and therefore an optimal composition for realizing superconducting properties could not be obtained, the product of Comparative Example 2 had only a low $J_C$ value. The product of Comparative Example 1 sintered and heating under the conditions falling within the ranges of the present invention but then cooled under the conditions outside the ranges of the present invention had a single phase having an optimal composition for realizing superconducting properties. In the cooling process, however, cracks were produced or a reaction for degrading superconducting properties occurred in the molded body.

Therefore, the product of Comparative Example 1 had only a low $J_C$ value.

EXAMPLE 6

A) A block was prepared by mixing $Bi_2O_3$, $SbCO_3$, $CaCO_3$, and CuO at a molar ratio of 2:2:1:2 and compression-molding the mixture.

B) A block was prepared by melting a substance consisting of $Bi_2O_3$, $SrCO_3$, $CaCO_3$, and CuO (molar ratio=2:2:1:2) at a temperature of 950° C. or more and solidifying the melted substance.

C) A block was prepared by performing a heat treatment for a mixture consisting of $SrCO_3$, $CaCO_3$, and CuO, adding $Bi_2O_3$ to the resultant mixture to form a primary heated powder, and then compression-molding the primary heated powder.

D) A paste was prepared by mixing $Bi_2O_3$, $Sr(NO_3)_2$, $Ca(NO_3)_2$, and CuO at a molar ratio of 2:2:1:2, performing a heat treatment at 800° C. for six hours and milling the resultant mixture, and then mixing a binder consisting of an organic substance to the milled substance. In this case, the paste was applied on a zirconia substrate and its size was 5 mm×0.5 mm×30 mm.

Precursor molded bodies of the Bi type oxide superconductors prepared by the above methods A) to D) were uniformly subjected to the following heat treatment for producing a superconducting phase in an oxygen atmosphere.

The heat treatment was performed at 900° C. for 30 minutes, at 920° C. for ten minutes, and at 880° C. for six hours. Thereafter, each molded body was cooled to 600° C. at a cooling rate of 2° C./min, and then the atmosphere was switched to a nitrogen atmosphere to perform slow cooling to a room temperature.

$J_C$ and $T_C$ values of the prepared molded bodies were measured. The measurement results are listed in Table 4 below.

TABLE 4

| | $J_C$ (A/cm$^2$) | $T_C$ (K) |
|---|---|---|
| A | 700 | 93 |
| B | 1,300 | 93 |
| C | 1,500 | 94 |
| D | 2,000 | 94 |

The Bi-Sr-Ca-Cu-O type oxide superconductor has been described above. However, the method of the present invention can be applied to another Bi type oxide superconductor such as a Bi-Pb-Sr-Ca-Cu-O type.

As has been described above, according to the method of the present invention, a low-temperature phase of the Bi type oxide superconductor can be formed without excessively absorbing oxygen. Therefore, since the Bi type oxide superconductor superior in superconducting properties such as $T_C$ and $J_C$ can be stably manufactured, significant industrial effects can be obtained.

What is claimed is:

1. A method of manufacturing a bismuth oxide superconductor comprising:
   (i) applying a two-stage heat treatment to a molded body of a substance selected from the group consisting of (a) a bismuth oxide superconducting substance comprising bismuth, an alkaline earth metal, copper and oxygen and (b) a precursor thereof, to produce a superconducting phase, a first stage of the two-stage heat treatment being applied to heat and sinter said molded body at a temperature within a temperature range from a temperature of $T_M-20°$ C. inclusive, $T_M$ being the melting start temperature of said substance which is heated and sintered, to a temperature $T_M+40°$ C. exclusively, and a second stage of the two-stage heat treatment being applied to heat the molded body in an atmosphere having an oxygen partial pressure of not less than 0.2 atm at a temperature from 700° C. to 890° C; and
   (ii) cooling the heated body from 700° C. to 100° C. in an atmosphere having an oxygen partial pressure of not less than 0.2 atm at a cooling rate of not less than 12° C./minute, thereby suppressing the oxygen content of said bismuth oxide superconductor and providing a bismuth oxide superconductor having a high critical temperature and a high critical current density.

2. The method according to claim 1, wherein the precursor of the bismuth oxide superconductor comprising bismuth, an alkaline earth metal, copper and oxygen is selected from the group consisting of a mixture of a substance selected from bismuth and a compound containing bismuth, an alkaline earth metal type substance selected from an alkaline earth metal and a compound containing an alkaline earth metal and a substance selected from copper and a compound containing copper, and a composite oxide containing an element of bismuth, an alkaline earth metal, and copper, and wherein said molded body is a molded body of said precursor.

3. The method according to claim 1, wherein the Bi oxide superconductor is a Bi-Sr-Ca-Cu-O type oxide superconductor.

4. The method according to claim 1, wherein the bismuth oxide superconductor is selected from the group consisting of a $Bi_2Sr_2CaCu_2O_x$ oxide superconductor and a $Bi_2Sr_2CaCu_2O_x$ oxide superconductor which further contains Pb.

5. The method according to claim 4, wherein in (i), in said first stage, said molded body is heated at a temperature of 880° to 950° C.

6. The method according to claim 1, wherein in (i), in said first stage, said molded body is heated at a temperature of 880° to 950° C.

7. A method of manufacturing a bismuth oxide superconductor comprising
   (i) applying a two-stage heat treatment to a molded body of a substance selected from the group consisting of (a) a bismuth oxide superconducting substance comprising bismuth, an alkaline earth metal, copper and oxygen and (b) a precursor thereof, to produce a superconducting phase, a first stage of the two-stage heat treatment being applied to heat and sinter said molded body at a temperature within a temperature range from a temperature of $T_M-20°$ C. inclusive, $T_M$ being the melting start temperature of said substance which is heated and sintered, to a temperature $T_M+40°$ C. exclusively, and a second stage of the two-stage heat treatment being applied to heat the molded body in an atmosphere having an oxygen partial pressure of not less than 0.2 atm at a temperature from 700° C. to 890° C.; and
   (ii) cooling the heated body from 700° C. to 100° C. in an atmosphere having an oxygen partial pressure of at most 0.08 atm at a cooling rate of at most 5° C./minute, thereby suppressing the oxygen content of said bismuth oxide superconductor and providing a bismuth oxide superconductor having a high critical temperature and a high critical current density.

8. The method according to claim 7, wherein the molded body is a precursor of the bismuth oxide superconductor comprising bismuth, an alkaline earth metal, copper and oxygen and is selected from the group consisting of (i) a mixture of a substance selected from the group consisting of bismuth and a compound containing bismuth, an alkaline earth metal substance selected from the group consisting of an alkaline earth metal and a compound containing an alkaline earth metal and a substance selected from the group consisting of copper and a compound containing copper and (ii) a composite oxide containing bismuth, an alkaline earth metal and copper, and wherein said molded body is a molded body of said precursor.

9. The method according to claim 7, wherein the bismuth oxide superconductor is a Bi-Sr-Ca-Cu-O oxide superconductor.

10. The method according to claim 7, wherein the bismuth oxide superconductor is selected from the group consisting of a $Bi_2Sr_2CaCu_2O_x$ oxide superconductor and a $Bi_2Sr_2CaCu_2O_x$ oxide superconductor which further contains Pb.

11. The method according to claim 7, wherein in (i), in said first stage, said molded body is heated at a temperature of 880° to 950° C.

12. The method according to claim 9, wherein in (i), in said first stage, said molded body is heated at a temperature of 880° to 950° C.

13. A method of manufacturing a bismuth oxide superconductor comprising
(i) applying a two-stage heat treatment to a molded body of a substance selected from the group consisting of (a) a bismuth oxide superconducting substance comprising bismuth, an alkaline earth metal, copper and oxygen and (b) a precursor thereof, to produce a superconducting phase, a first stage of the two-stage heat treatment being applied to heat and sinter said molded body at a temperature within a temperature range from a temperature of $T_M-20°$ C. inclusive, $T_M$ being the melting start temperature of said substance which is heated and sintered, to a temperature $T_M+40°$ C. exclusively, and a second stage of the two-stage heat treatment being applied to heat the molded body in an atmosphere having an oxygen partial pressure of not less than 0.2 atm at a temperature from 700° C. to 890° C.; and
(ii) cooling the heated body thereby forming a superconductor containing excessive oxygen, followed by heating said superconductor containing excessive oxygen in an atmosphere having an oxygen partial pressure of at most 0.08 atm at a temperature of 120° C. to 650° C. for 3 to 20 hours thereby removing the excessive oxygen from the superconductor, and providing a bismuth oxide superconductor having a high critical temperature and a high critical current density.

14. The method according to claim 13, wherein the molded body is a precursor of the bismuth oxide superconductor comprising bismuth, an alkaline earth metal, copper and oxygen and is selected from the group consisting of (i) a mixture of a substance selected from the group consisting of bismuth and a compound containing bismuth, an alkaline earth metal substance selected from the group consisting of an alkaline earth metal and a compound containing an alkaline earth metal and a substance selected from the group consisting of copper and a compound containing copper and (ii) a composite oxide containing bismuth, an alkaline earth metal and copper, and wherein sad molded body is a molded body of said precursor.

15. The method according to claim 13, wherein the bismuth oxide superconductor a Bi-Sr-Ca-Cu-O oxide superconductor.

16. The method according to claim 13, wherein the bismuth oxide superconductor is selected from the group consisting of a $Bi_2Sr_2CaCu_2O_x$ oxide superconductor and a $Bi_2Sr_2CaCu_2O_x$ oxide superconductor which further contains Pb.

17. The method according to claim 13, wherein in (i), in said first stage, said molded body is heated at a temperature of 880° to 950° C.

18. The method according to claim 15, wherein in (i), in said first stage, said molded body is heated at a temperature of 880° to 950° C.

* * * * *